United States Patent [19]
Ross et al.

[11] Patent Number: 5,986,874
[45] Date of Patent: *Nov. 16, 1999

[54] ELECTROSTATIC SUPPORT ASSEMBLY HAVING AN INTEGRAL ION FOCUS RING

[75] Inventors: Eric Ross, Santa Cruz; Jae Park, Cupertino; Alexandre de Chambrier, Capitola, all of Calif.

[73] Assignee: Watkins-Johnson Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/868,041

[22] Filed: Jun. 3, 1997

[51] Int. Cl.$^6$ ................................................. H02N 13/00
[52] U.S. Cl. ............................................ 361/234; 279/128
[58] Field of Search ................................ 361/234, 233; 279/128

[56] References Cited

U.S. PATENT DOCUMENTS

| | | | |
|---|---|---|---|
| 3,634,740 | 1/1972 | Stevco | 361/234 |
| 3,916,270 | 10/1975 | Wachtler et al. | 361/234 |
| 4,184,188 | 1/1980 | Briglia | 361/234 |
| 4,313,783 | 2/1982 | Davies et al. | 156/643 |
| 4,384,918 | 5/1983 | Abe | 156/643 |
| 4,399,016 | 8/1983 | Tsukada et al. | 204/192 R |
| 4,709,655 | 12/1987 | Van Mastrigt | 118/719 |
| 4,968,374 | 11/1990 | Tsukada et al. | 156/345 |
| 5,099,571 | 3/1992 | Logan et al. | 29/825 |
| 5,207,437 | 5/1993 | Barnes et al. | 361/234 |
| 5,221,450 | 6/1993 | Hattori et al. | 204/192.32 |
| 5,325,261 | 6/1994 | Horwitz | 361/234 |
| 5,376,213 | 12/1994 | Ueda et al. | 156/345 |
| 5,452,177 | 9/1995 | Frutiger | 361/234 |
| 5,452,510 | 9/1995 | Barnes et al. | 29/825 |
| 5,467,249 | 11/1995 | Barnes et al. | 361/234 |
| 5,522,131 | 6/1996 | Steger | 29/829 |
| 5,529,657 | 6/1996 | Ishii | 156/345 |
| 5,530,616 | 6/1996 | Kitabayashi et al. | 361/234 |
| 5,539,609 | 7/1996 | Collins et al. | 361/234 |
| 5,595,627 | 1/1997 | Inazawa et al. | 156/643.1 |
| 5,660,740 | 8/1997 | Komino | 216/67 |
| 5,673,922 | 10/1997 | Sherstinsky et al. | 361/234 |
| 5,716,534 | 2/1998 | Tsuchiya et al. | 216/67 |
| 5,740,009 | 4/1998 | Pu et al. | 361/234 |
| 5,783,492 | 7/1998 | Higuchi et al. | 438/710 |
| 5,789,324 | 8/1998 | Canale et al. | 438/714 |

OTHER PUBLICATIONS

Wardly, G., "Electrostatic Wafer Chuck for Electron Beam Microfabrication", *Rev. Sci. Instrum.*, vol. 44, No. 10, Oct. 1973, pp. 1506–1509.

*Primary Examiner*—Fritz Fleming

[57] ABSTRACT

An electrostatic support assembly for supporting a substrate. The support assembly includes a non-metallic body having a support surface for supporting the substrate and an integral peripheral outer portion extending outwardly from and substantially surrounding the support surface of the substrate. The support assembly also includes at least one electrode carried by the non-metallic body for electrostatically coupling a substrate to the support surface of the non-metallic body and a base coupled to the underside of the non-metallic body for the transfer of heat between the non-metallic body and the base.

29 Claims, 3 Drawing Sheets

ELECTROSTATIC SUPPORT ASSEMBLY HAVING AN INTEGRAL ION FOCUS RING

BRIEF DESCRIPTION OF THE INVENTION

This invention relates in general to a support assembly for retaining a substrate such as a semiconductor wafer during processing, and more particularly, to a support assembly in which the substrate is electrostatically clamped to the support.

BACKGROUND OF THE INVENTION

Electrostatic support systems or electrostatic chucks have been used to support a substrate, such as a semiconductor wafer, during chemical vapor deposition, sputtering, etching, and other processes. Electrostatically clamping the substrate to the support offers several advantages. The substrate is held against the support by applying a voltage to the support and inducing an image charge on the wafer, with the different potentials attracting the wafer to the support surface. Unlike systems with perimeter clamping rings, electrostatically clamping the substrate to the support leaves the entire upper surface of the substrate exposed for processing. The risk of surface contamination due to the mechanical clamp is also eliminated. In addition, the entire substrate is tightly clamped to the surface of the support by the electrostatic attraction, improving the heat transfer between the substrate and the support. Retaining the substrate or wafer at a substantially constant temperature during processing is important for controlling the chemical process, obtaining process uniformity, and preventing damage to the integrated circuitry already formed on the substrate.

Electrostatic support systems typically include electrodes mounted to a cooled support body. An inert gas, such as helium, is introduced into the space between the substrate and the support surface to facilitate cooling of the substrate. A dielectric coating typically covers the electrodes so that clamping forces exceeding the backing pressure of the heat transfer gas may be obtained. During processing, the substrate is positioned on the dielectric coated electrodes such that the electrodes are isolated from the plasma and process gases. A separate dielectric ion focus ring typically encircles the electrodes to insulate the sides of the electrostatic support from plasma and ensures the electrostatic potential contours remain constant across the entire surface of the wafer so that the center of the substrate and the regions near the edge of the substrate may be exposed to a substantially uniform distribution of the process gases. If the electrostatic support does not include an ion focus ring, electrostatic potential contour lines and ion flux will drop off at the edge of the wafer such that the edge of the wafer is not exposed to a uniform distribution of the process gases. A dielectric ion focus ring ensures the electrostatic potential contours are held constant at the edge of the wafer and reduces the focusing of the ions onto the wafer edge. The upper surface of the focus ring is typically parallel with or below the upper surface of the wafer.

While this ion focus ring provides some protection for the electrodes and underside of the substrate, the separate dielectric ring is thermally uncontrolled because of poor thermal coupling between the different materials of the ceramic ring and the metallic electrode base. Thus, the separate ion focus ring often has an adverse effect on the uniform heat transfer profile between the substrate and the electrostatic support. The use of the ion focus ring also limits the total area of the electrodes for an electrostatic chuck of a given size. If the tolerances of the ion focus ring and electrode base and the assembly of the components are not strictly monitored, the ion focus ring may interfere with the proper placement of the substrate on the electrode base.

An electrostatic support assembly which maximizes the uniform heat transfer between the substrate or wafer and the support assembly is desirable. Increasing the area available for the electrode such that the electrode may extend to the outer edge of the substrate is also desirable. Providing a support assembly which facilitates the accurate placement of the substrate on the support is also desirable. Minimizing the number of components of the assembly also offers the advantages of improved quality and reduced cost.

OBJECTS AND SUMMARY OF THE INVENTION

It is a primary object of the present invention to provide an electrostatic support system for supporting a substrate, such as a wafer, during processing.

It is another object of the present invention to provide an electrostatic support system which optimizes the uniform heat transfer between the substrate and the support.

It is yet another object of the present invention to provide an electrostatic support system which maximizes the area available for electrode placement while isolating the support surface and underside of the substrate from plasma and process reagents.

It is still another object of the present invention to provide an electrostatic support system which facilitates the accurate placement of the substrate on the support.

A more general object of the present invention is to provide an electrostatic support assembly which includes a minimum number of components, and which may be efficiently and economically manufactured and maintained.

In summary, this invention provides an electrostatic support assembly which is particularly suitable for retaining a substrate such as a semiconductor wafer during processing. The support assembly generally includes a ceramic or non-metallic body having a support surface of sufficient size to support the selected substrate and an integral ion focus ring substantially surrounding the support surface. The integral ion focus ring forms a barrier which protects to the central portion of the non-metallic body and the underside of the substrate from plasma, process gases and RF fields. At least one and preferably two electrodes are carried by the ceramic body for electrostatically coupling a substrate to the support surface. A base is coupled to the underside of the ceramic body for the transfer of heat between the ceramic body and the base. The base extends beneath the integral ion focus ring and support surface, maximizing the uniform heat transfer between the ceramic body and base to improve the uniform heat transfer between the substrate and the ceramic body.

In one modification of the invention, the ceramic body includes an integral barrier ridge projects upwardly from and substantially surrounding the support surface. The integral ridge facilitates accurate placement of a substrate on the support surface and provides additional protection for the edge of the substrate.

Additional objects and features of the invention will be more readily apparent from the following detailed description and appended claims when taken in conjunction with the drawings.

DETAILED DESCRIPTION OF THE INVENTION

Figure 1:
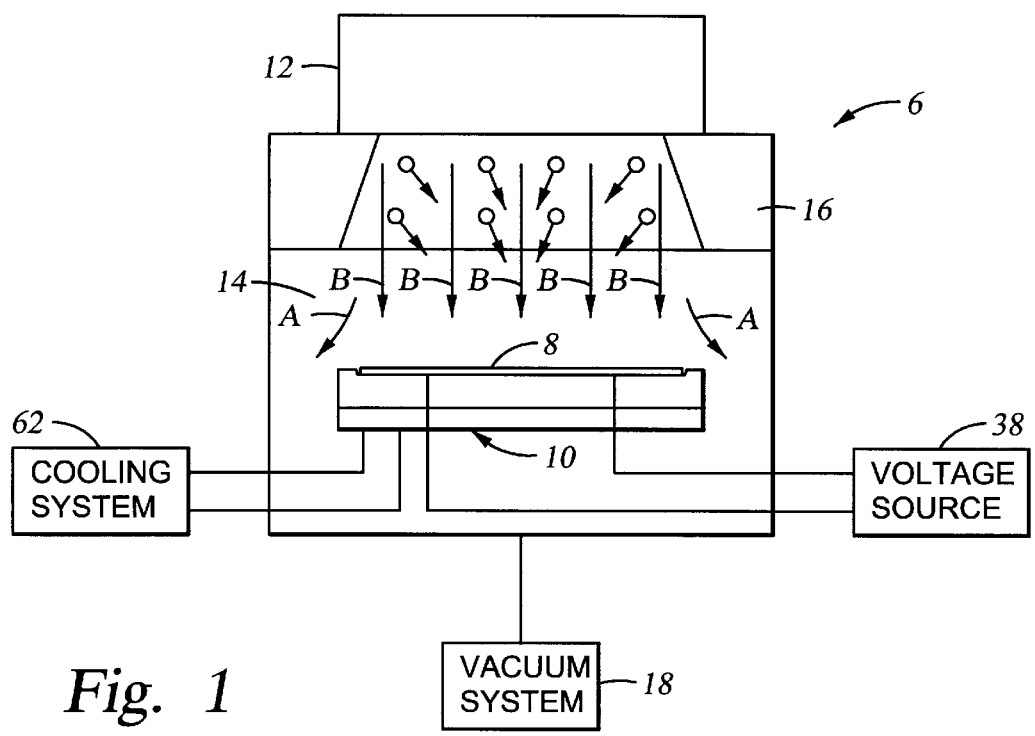
FIG. 1 is a schematic view of an electrostatic support assembly constructed in accordance with this invention, shown installed in a processing chamber.
Figure 2:
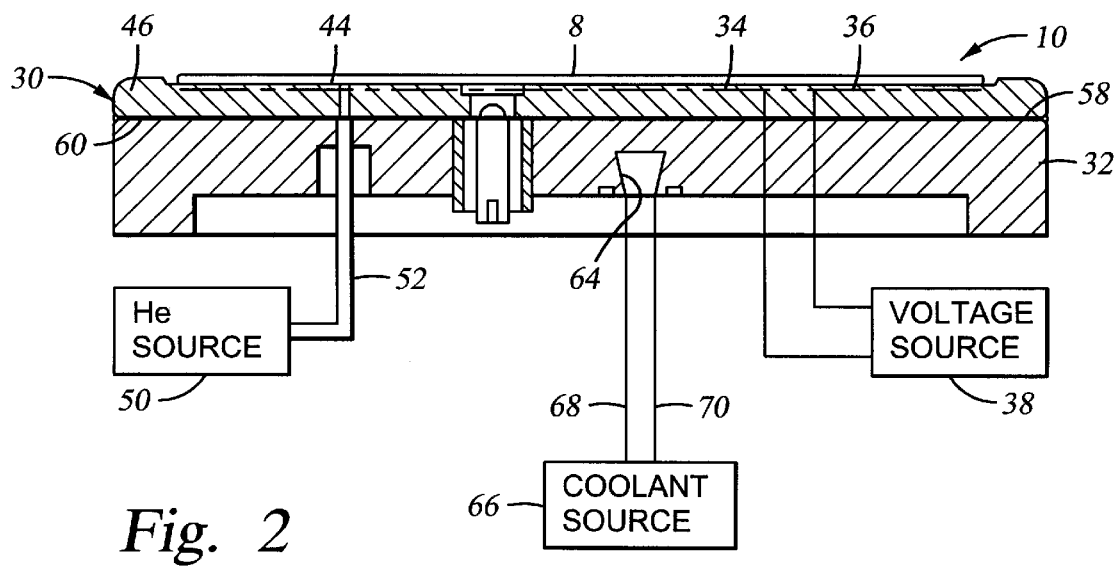
FIG. 2 is a sectional view of the electrostatic support assembly of FIG. 1, shown supporting a semiconductor wafer.
Figure 3:
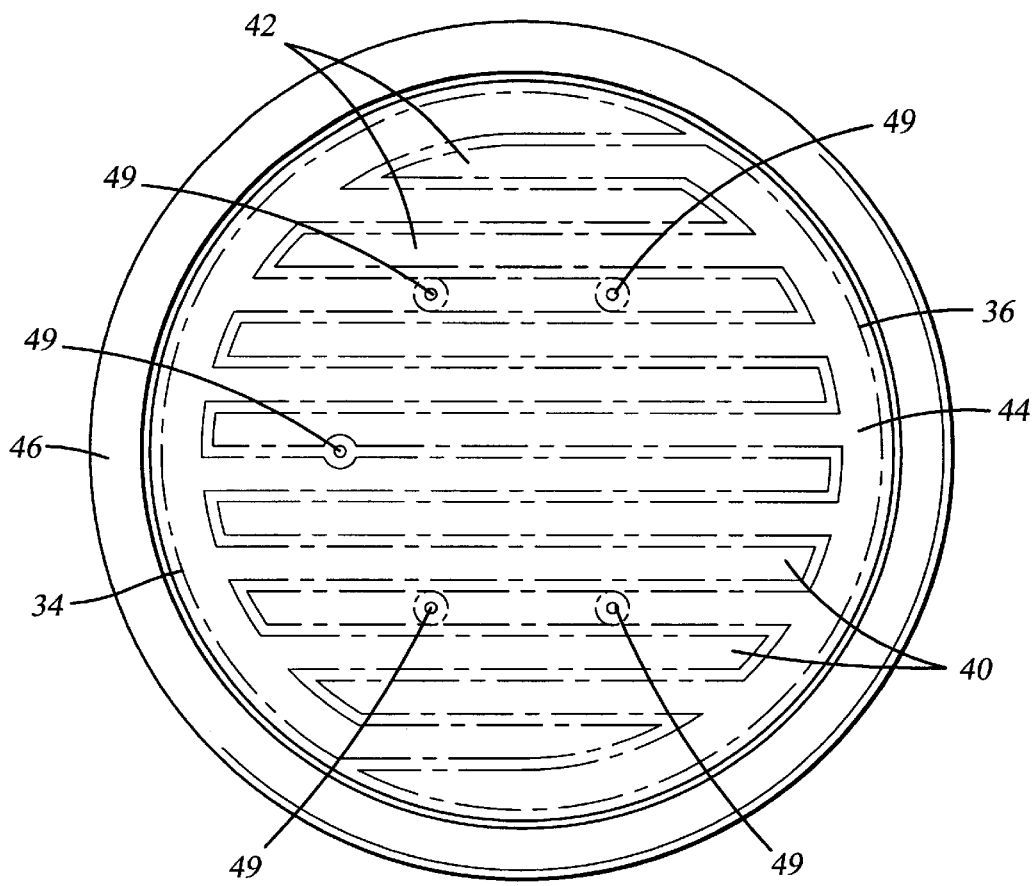
FIG. 3 is a top plan view of the electrode pattern of the electrostatic support assembly of FIG. 1.
Figure 4:
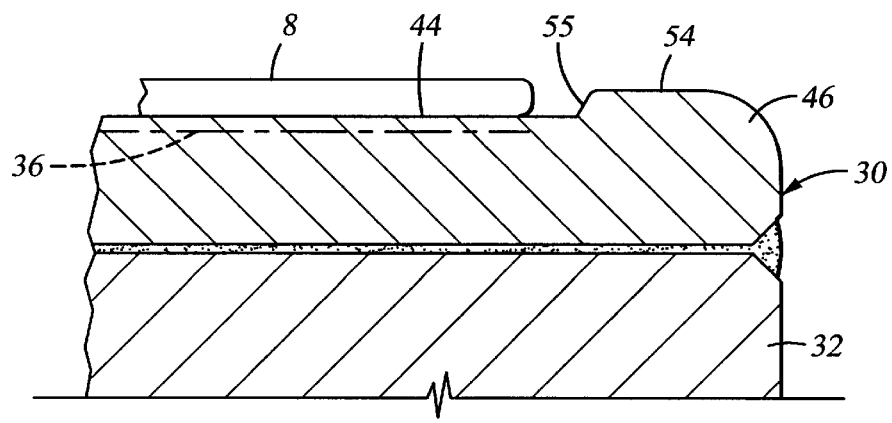
FIG. 4 is an enlarged, sectional view, partially broken away, of the electrostatic support assembly of FIG. 1, shown supporting a semiconductor wafer.

Reference is now made in detail to the preferred embodiment of the invention, which is illustrated in the accompanying figures. Turning now to the drawings, wherein like components are designated by like reference numerals throughout the various figures, attention is directed to FIG. 1.

FIG. 1 schematically shows a processing system 6 for processing a substrate, such as a semiconductor wafer 8. An electrostatic support system 10, constructed in accordance with this invention, is employed to support the wafer 8 during processing. The electrostatic support system 10 of this invention is particularly suitable for use with high density plasma chemical vapor deposition (HDP CVD), although support system 10 may also be used with other types of processing including, but not limited to, plasma-enhanced chemical vapor deposition, chemical vapor deposition, sputtering, etching and the like. In the illustrated embodiment, the support system 10 is installed in a HDP CVD system of the type shown in the co-pending Ser. No. 08/500,493, the disclosure of which is incorporated herein by reference. The processing system 6 generally includes a plasma source 12 positioned above a reaction chamber 14, a gas distribution apparatus 16 disposed in the reaction chamber 14, and a vacuum system 18 for removing exhaust from the reaction chamber 14. The plasma source 12, gas distribution apparatus 16 and vacuum system 18 may be provided by the devices disclosed in co-pending Ser. No. 08/500,493 or by other suitable devices.

The processing system 6 is adapted for performing various processing operations including deposition, film etchback, reactor self-clean and simultaneous etch and deposition steps. By way of example, the processing system 6 may be used for a deposition operation in which oxygen and a mixture of silane and argon are injected into the reaction chamber 14 by the gas distribution apparatus 16. Silane, oxygen and argon molecules migrate from the reaction chamber 14 into the chamber (not shown) of the plasma source 12 and are ionized by the plasma source. The plasma source 12 may also include a gas injection manifold (not shown) which may deliver argon and oxygen directly into the plasma chamber. The ionized gases or plasma and active species of the gaseous substances injected by the distribution apparatus 16 move downwardly onto the wafer surface and deposit a layer of film on the wafer. An RF bias may be applied to the support assembly 10 to increase the floating potential of the plasma in the localized area of the support assembly 10. The self-bias induced by applying the RF bias to the surface of the support assembly 10 accelerates ions diffusing into the plasma sheath in the region of the support assembly and towards the wafer 8 retained by the support assembly 10.

Turning to FIGS. 2–6, the support system 10 of this invention generally includes a ceramic or non-metallic body 30 mounted to a base 32 and first and second electrodes 34 and 36. The electrodes 34 and 36 are electrically connected to a voltage source 38 through RC filters (not shown) as is known in the art. The voltage source 38 applies a DC bias, with the polarity of the electrode 34 being opposite that of electrode 36. The applied DC potentials on the electrodes 34 and 36 generate image charges on the back surface of the wafer 8 to electrostatically attract the wafer to the ceramic body 30, securely clamping the wafer to the ceramic body. The polarity of the electrodes may be reversed, for example by activating a gang switch (not shown) each time a wafer is removed from ceramic body 30 to minimize any residual charges or polarization which may interfere with the release of the wafer from the support surface. Although in the illustrated embodiment the support assembly 10 includes two electrodes, it is to be understood that in other modifications of the invention the support assembly may include a single electrode or more than two electrodes. As is shown particularly in FIG. 3, in the illustrated embodiment the electrodes include a plurality of spaced fingers 40 and 42, respectively, arranged in an alternating configuration. However, it is to be understood that the configuration of the electrodes 34 and 36 is subject to considerable variation within the scope of this invention.

In the illustrated embodiment, the electrodes 34 and 36 are embedded in the ceramic body 30 by laminating the electrode between sheets of uncured ceramic and then firing by Toto LTD., of Japan. Alternatively, the electrodes 34 and 36 may be embedded in the ceramic body 30 using other suitable techniques such as deposition by Semco Engineering of France.

Figure 5:
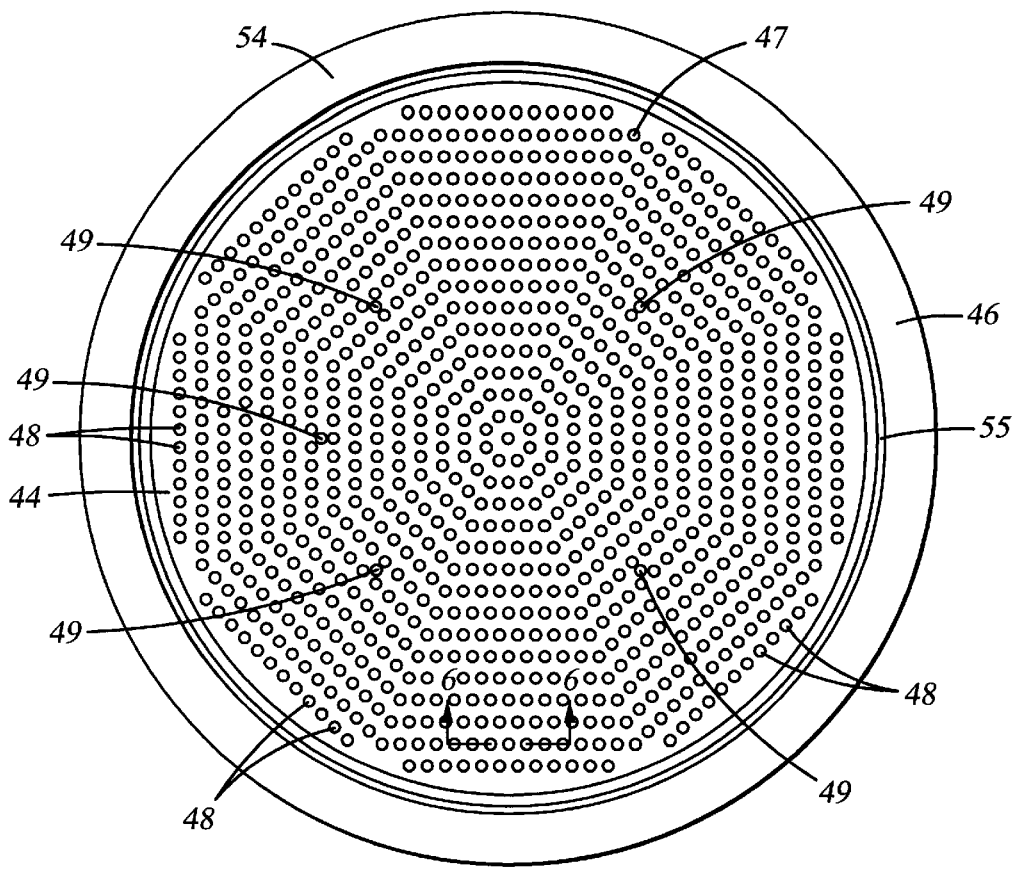
FIG. 5 is a top plan view of the electrostatic support assembly of FIG. 1.
Figure 6:
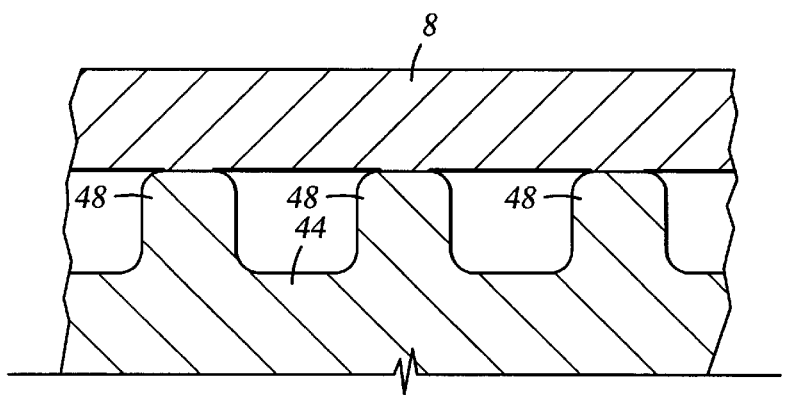
FIG. 6 is an enlarged, sectional view of the support surface taken substantially along line 6—6 of FIG. 5, shown supporting a semiconductor wafer.

The monolithic ceramic body 30 generally includes a support surface 44 of sufficient size to support the wafer 8 and a peripheral outer portion 46 extending outwardly from and substantially surrounding the support surface 44 and electrodes 34 and 36. The support surface 44 is not smooth, but is formed with a network of raised areas or fingers 48 surrounded by a plurality of valleys as is shown for example in FIGS. 5 and 6. During operation of the support assembly 10, the wafer 8 is clamped against the surface of the raised areas 48. FIG. 5 shows the raised area distribution for the support assembly 10 of this invention, with each circle 47 representing a raised surface contacted by the wafer 8. It is to be understood that the actual distribution of the raised areas 48 is subject to considerable variation within the scope of this invention. A plurality of inlet holes 49 are formed in the support surface between the raised areas and coupled to a helium source 50 via conduit 52. The lifting pins (not shown) used to move the wafer 8 relative to the support surface extend through three of the inlet holes 49 as is disclosed in co-pending application Ser. No. 08/500,480, the disclosure of which is incorporated herein by reference. When the electrodes 34 and 36 clamp the wafer 8 against the raised areas 48 of the support surface 44, a cooling gas such as helium is fed through the inlet holes and distributed throughout the valleys surrounding the raised areas 48, filling the space between the underside of the wafer and the support surface 44 to cool the wafer during processing. Using numerous, relatively small raised areas as shown in FIG. 5 allows the cooling gas to be quickly and evenly distributed across the underside of the wafer.

In the illustrated embodiment, the peripheral outer portion 46 projects upwardly from the plane of the support surface 44 such that the upper surface 54 of the outer portion 46 is at approximately the same height as or slightly above the exposed surface of the wafer 8. For example, in the illustrated embodiment of the invention the height of the upper surface 54 above the support surface 44 is in the range of 0 to 0.050 inches. A beveled inner surface 55 joins the upper surface 54 and support surface 44, the shape of inner surface 55 facilitating the placement of the wafer 8 on the support surface although the inner surface 55 may also have other shapes. As is shown particularly in FIG. 4, the edge of the wafer 8 is in close proximity to the inner surface 55. As discussed above, the peripheral outer portion 46 defines an intergral ion focusing which directs the plasma and RF field lines away from the outer edge of the wafer as indicated by arrows A so that the center and outer region of the wafer are subjected to substantially the same field as indicated by arrows B, improving the uniformity of the film deposited on the wafer surface. The raised outer portion of the illustrated embodiment also facilitates placement of the wafer 8 on the ceramic body by guiding the wafer onto the support surface and isolates the support surface and underside of the wafer from the plasma.

The integral support surface 44 and peripheral outer portion 46 of the ceramic body 30 of this invention provides improved deposition uniformity without requiring the use of a separate dielectric ion focus ring around the electrodes and base. Eliminating the separate ion focus ring is of particular advantage in that problems associated with the use of a separate ion focus ring, such as sizing problems, component mismatch and interference with wafer placement, are eliminated. The area of the wafer along its peripheral edge are subjected to more uniform cooling because the cooling gas may be delivered closer to the edge of the wafer, reducing the temperature gradients at the edge of the wafer. In addition, the electrodes 34 and 36 may be extended beyond the edge of the wafer 8 as is shown in particularly in FIG. 4. Extending the surface area of the electrodes 34 and 36 provides a uniform clamping force across the entire wafer and allows for a more uniform RF delivery to the plane of the wafer surface. The combination of improved clamping and RF delivery at the edges of the wafer reduces edge effects occurring with standard electrostatic support, improving the usable surface area of the wafer for high quality films. In the illustrated embodiment, the total diameter of the electrode coverage may be increased by 0.24 to 0.4 inches compared with supports which require a separate ion focus ring. Instead of the electrodes shown in the Figures, the support assembly 10 may include electrodes which terminate before or at the edge of a wafer 8 positioned on the support surface 44.

In this embodiment, the ceramic body 30 is formed primarily of aluminum oxide ($Al_2O_3$) but may be formed of any suitable non-metallic ceramic or glass material such as aluminum nitride (AlN). The ceramic body of this embodiment is fabricated by laminating and firing, although the body may be formed using any suitable manufacturing technique.

Retaining the wafer 8 at a substantially constant temperature during processing is important for controlling the chemical process, obtaining process uniformity, and preventing damage to the integrated circuitry already formed on the substrate. When the electrodes 34 and 36 are activated, wafer 8 is clamped against surface 44 of the ceramic body 30 such that the helium or other cooling gas uniformly transfers heat from the wafer to the ceramic body 30. To ensure the wafer is maintained at a substantially constant temperature during processing, the base 32 of the support system 10 of this invention is configured for the uniform transfer of heat between the ceramic body 30 and base 32.

Base 32 has an upper surface 58 contiguous with the underside 60 of the ceramic body 30 to facilitate heat transfer between the ceramic body and base. As is shown particularly in FIG. 2, the upper surface 58 of the base is substantially the same shape and size as the underside 60 of the ceramic body such that uniform heat transfer between the two components is obtained across the entire ceramic body. In this embodiment, the base 32 may be soldered or brazed to the ceramic body 30 using solder or braze materials compatible with ceramic and metals. Other suitable mounting methods include mechanically clamping the base 32 and ceramic body 30 together, with or without a thermally conductive compliant material (such as inert gas, greases, epoxies, or soft metals such as indium) in between the two. The use of thermally conductive compliant bodies enhances the transfer of heat. The base 32 is formed of aluminum, although other suitable materials such as stainless steel may be used. Uniformly extracting heat from the ceramic body minimizes or prevents the accumulation of excess heat in discrete areas of the ceramic body, where such heat pockets may interfere with the uniform removal of heat from the wafer 8 such that the entire wafer 8 is not maintained at the desired constant temperature. Thus, the base 32 of this invention may be used to maintain a substantially uniform heat transfer between the wafer 8 and the ceramic body 30 during processing.

In accordance with the support assembly 10 of this invention, a cooling system 62 is coupled to the base 32 to remove heat from the base. Base 32 includes at least one channel or passageway 64 formed in the base 32. The passageway 64 is coupled to a coolant source 66 via conduits 68 and 70. The coolant source 66 pumps a cooling fluid, such as water, ethylene glycol, propylene glycol or another suitable fluid, through a loop including conduit 68, passageway 64 and conduit 70. The fluid returning to the coolant source 66 is cooled as is known in the art and then pumped through the base 32 again. Instead of the cooling system 62 of the illustrated embodiment, other suitable temperature control means may be used to cool the base 32.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A substrate support comprising:
    a non-metallic body having a support surface for supporting a substrate and an integral peripheral outer ring portion extending outwardly from said support surface and substantially surrounding a substrate positioned on said non-metallic body, said outer ring portion defining an integral ion focus ring configured to direct plasma and RF field lines away from the edge of a substrate positioned on said support surface such that the exposed surface of the substrate is exposed to a substantially uniform field during processing;
    at least one electrode carried by said non-metallic body for electrostatically coupling a substrate to said support surface of said non-metallic body; and a base coupled to the underside of said non-metallic body for the transfer of heat between said non-metallic body and said base, said base extending below said support surface and said outer ring portion of said non-metallic body, said base being formed of a thermally conductive material for uniformly cooling said support surface and said outer ring portion of said non-metallic body.

2. The substrate support of claim 1 in which an upper surface of said outer ring portion and said support surface define a first major surface of said non-metallic body, said non-metallic body having a second major surface spaced from said first major surface and a peripheral edge joining said first and second major surfaces, said base having a first major surface contiguous with said second major surface of said non-metallic body.

3. The substrate support of claim 1 in which said outer ring portion projects upwardly from said support surface such that said support surface defines a recessed central portion of said non-metallic body.

4. The substrate support of claim 3 in which said outer ring portion has an upper surface and a beveled inner surface joining said upper surface of said outer ring portion and said support surface.

5. The substrate support of claim 1 in which said non-metallic body is formed of a ceramic material.

6. The substrate support of claim 1, and further comprising a second electrode carried by said non-metallic body for electrostatically coupling a substrate to said support surface of said non-metallic body.

7. The assembly of claim 1 in which said electrode extends across an area of said non-metallic body having a size greater than the size of a substrate supported on said support surface.

8. The substrate support of claim 1, and further comprising a heat removal system for removing heat from said base.

9. The substrate support of claim 8 in which said heat removal system includes a passageway formed in said base for the flow of a cooling fluid therethrough.

10. The substrate support of claim 9 in which said heat removal system includes a source of cooling fluid coupled to said passageway for circulating cooling fluid through said passageway.

11. The substrate support of claim 1 in which said support surface is formed with a plurality of fingers for supporting a substrate, said fingers defining a network between said fingers for distributing an inert cooling gas between said support surface and the underside of the substrate.

12. In combination, the substrate support of claim 1 and a semiconductor wafer electrostatically attracted to said support surface by said electrode.

13. The support system of claim 1 in which said base is formed of metal.

14. An assembly for supporting a substrate during plasma-enhanced processing comprising:
a base member;
a support body superimposed on said base member and having a substrate support region for supporting a substrate and an integral outer ring portion extending outwardly from and substantially surrounding said support surface and configured for directing plasma and RF field lines outwardly of the peripheral edge of the substrate such that the exposed surface of the substrate is exposed to a substantially uniform field during processing, said support region including a plurality of spaced-apart, upward projecting fingers for supporting a substrate and a distribution network provided between said fingers for distributing an inert cooling gas adjacent the underside of the substrate, said support body being coupled to said base for the transfer of heat between said support body and said base; and
a biasing device carried by one of said support body and said base for electrostatically coupling a substrate to said support surface.

15. The assembly of claim 14 in which said base extends substantially to the peripheral edge of said support body.

16. The assembly of claim 14, and further comprising a cooling system coupled to said base for removing heat from said base.

17. The assembly of claim 14 in which said outer ring portion extends upwardly from said support region to define a barrier ridge extending around the peripheral edge of a substrate positioned on said support region for isolating said support region and the underside of the substrate.

18. The substrate support of claim 17 in which said outer ring portion has an upper surface and a beveled inner surface joining said upper surface of said outer ring portion and said support region.

19. The assembly of claim 14 in which said support body is formed of a non-metallic material.

20. The assembly of claim 14 in which said biasing device includes first and second electrodes mounted to said support body.

21. The assembly of claim 20 in which said electrodes extend across an area of said support body having a size greater than the size of a substrate supported on said support region.

22. In combination, the assembly of claim 14 and a semiconductor wafer electrostatically attracted to said support region by said biasing device.

23. A support system for retaining a substrate during processing comprising:
a ceramic body having a first major surface formed with a support surface configured for supporting a substrate and an integral ion focus ring extending outwardly from said support surface and configured for directing plasma and RF field lines outwardly of the peripheral edge of the substrate such that the exposed surface of the substrate is exposed to a substantially uniform field during processing, a second major surface spaced from said first major surface, and a peripheral edge joining said first and second major surfaces;
first and second electrodes carried by said ceramic body for electrostatically clamping a substrate to said support surface;
a metallic base member mounted to said ceramic body, said base member extending across said second major surface to said peripheral edge of said ceramic body for transferring heat between said ceramic body and said base to uniformly cool said ceramic body; and
a cooling system for removing heat from said base member.

24. The assembly of claim 23 in which said ion focus ring extends upwardly from said support surface to define a barrier ridge extending around the peripheral edge of a substrate positioned on said support surface for isolating said support surface and the underside of the substrate.

25. The substrate support of claim 24 in which said ion focus ring has an upper surface and a beveled inner surface joining said upper surface of said ion focus ring and said support surface.

26. The support system of claim 23 in which said cooling system includes a channel formed in said base member for the flow of a cooling fluid through said base member.

27. The support system of claim 23 in which said first and second electrodes extend outwardly of an area of said support surface covered by a substrate positioned on said support surface.

28. The support system of claim 23 in which said support surface is formed with a plurality of raised areas for supporting a substrate, said raised areas being separated by a plurality of valleys which define a network for distributing an inert cooling gas between said support surface and the underside of the substrate.

29. In combination, the support system of claim 23 and a semiconductor wafer electrostatically attracted to said support surface by said first and second electrodes.

* * * * *